United States Patent
Su

(10) Patent No.: US 7,550,896 B1
(45) Date of Patent: Jun. 23, 2009

(54) PIEZOELECTRIC ACTUATOR SYSTEM WITH POSITION DETECTION FUNCTION AND METHOD THEREOF

(75) Inventor: Jiong-Guang Su, Keelung (TW)

(73) Assignee: Silicon Touch Technology Inc., Hsinchu (TW)

( * ) Notice: Subject to any disclaimer, the term of this patent is extended or adjusted under 35 U.S.C. 154(b) by 0 days.

(21) Appl. No.: 12/168,156

(22) Filed: Jul. 7, 2008

(30) Foreign Application Priority Data

Mar. 18, 2008 (TW) .............................. 97109507 A

(51) Int. Cl.
*H01L 41/08* (2006.01)
(52) U.S. Cl. ............................... 310/316.02; 310/323.02
(58) Field of Classification Search ............ 310/316.01, 310/316.02, 323.02
See application file for complete search history.

(56) References Cited

U.S. PATENT DOCUMENTS

| 6,246,151 | B1 | 6/2001 | Nakano | |
| 6,249,093 | B1 * | 6/2001 | Takahata et al. | 318/129 |
| 6,512,321 | B2 * | 1/2003 | Yoshida et al. | 310/316.01 |
| 7,480,109 | B1 * | 1/2009 | Hu et al. | 359/824 |

* cited by examiner

*Primary Examiner*—Mark Budd
(74) *Attorney, Agent, or Firm*—Jianq Chyun IP Office

(57) ABSTRACT

A piezoelectric actuator system with a position detection function includes an immovable base, a piezoelectric material, a drive shaft, and a movable part. The immovable base has a driving circuit for providing a driving voltage. The piezoelectric material is fixed on the immovable base and electrically coupled to the driving circuit. A length of the piezoelectric material is controlled by the driving voltage. The drive shaft is fixed on the piezoelectric material and has at least two conductive parts having impedance materials. The movable part is disposed on the drive shaft, and a spacer made of a conductive material is installed at its bottom. The two conductive parts are electrically coupled to the spacer, so as to form a conduction path. The driving circuit detects an impedance of the conduction path to determine a position of the movable part.

14 Claims, 5 Drawing Sheets

PIEZOELECTRIC ACTUATOR SYSTEM WITH POSITION DETECTION FUNCTION AND METHOD THEREOF

CROSS-REFERENCE TO RELATED APPLICATION

This application claims the priority benefit of Taiwan application serial no. 97109507, filed Mar. 18, 2008. The entirety of the above-mentioned patent application is hereby incorporated by reference herein and made a part of this specification.

BACKGROUND OF THE INVENTION

1. Field of the Invention

The present invention generally relates to a piezoelectric actuator system with a position detection function and a method thereof, in particular, to a piezoelectric actuator system and a method thereof using the impedance detection to detect the position.

2. Description of Related Art

Piezoelectric actuator systems are actuator systems using voltages to achieve the effect of moving objects. In consideration of the production errors of the piezoelectric materials and the driving displacement errors, a conventional piezoelectric actuator system must be added with a positioning system. However, the conventional positioning system has a bulk volume, which hinders the miniaturization and simplification of the whole piezoelectric actuator system. Consequently, the conventional piezoelectric actuator system is inapplicable to small-sized precise devices such as lens modules of camera phones or pickup heads of thin-type optical disk drives.

FIG. 1A is a schematic side view of a conventional piezoelectric actuator system 10 in a stationary state. Referring to FIG. 1A, the conventional piezoelectric actuator system 10 includes an immovable base 12, a piezoelectric material 14, a drive shaft 16, and a movable object 18. The piezoelectric material 14 is fixed on the immovable base 12, and a length L of the piezoelectric material 14 varies according to the received voltage. That is to say, the piezoelectric material 14 deforms according to the received voltage. The drive shaft 16 is fixed on the piezoelectric material 14, and when the length L of the piezoelectric material 14 varies, the position of the drive shaft 16 changes accordingly. In FIG. 1A, the position of the drive shaft 16 is at $x_1$. The movable object 18 is disposed on the drive shaft 16. When the drive shaft 16 moves slowly, the movable object 18 will move along with the drive shaft 16 because of the friction there between. However, when the drive shaft 16 moves fast, the movable object 18 stays at its original position based on Newton's First Law of Motion (law of inertia). In FIG. 1A, the position of the movable object 18 is at $x_2$.

FIG. 1B is a schematic side view of the conventional piezoelectric actuator system 10 when a slowly increasing voltage is applied to the piezoelectric material 14. Referring to FIG. 1B, the slowly increasing voltage is applied to the piezoelectric material 14, so the length L of the piezoelectric material 14 becomes longer as compared with that when the piezoelectric actuator system 10 is in the stationary state. At this time, the drive shaft 16 moves due to the varying of the length L of the piezoelectric material 14. The movable object 18 moves along with the drive shaft 16 because of the friction there between, from $x_2$ to $x_3$.

FIG. 1C is a schematic side view of the conventional piezoelectric actuator system 10 when a rapidly dropping voltage is applied to the piezoelectric material 14. Referring to FIG. 1C, the rapidly dropping voltage is applied to the piezoelectric material 14, so the length L of the piezoelectric material 14 becomes shorter as compared with that under the conditions in FIG. 1B. The drive shaft 16 moves fast because the length L of the piezoelectric material 14 changes rapidly to the length obtained when the piezoelectric actuator system is in the stationary state. At this time, the position of the drive shaft 16 is at $x_1$. The movable object 18 stays at its original position, that is, $x_3$, based on Newton's First Law of Motion. As described above, by applying a slowly increasing voltage and a rapidly dropping voltage, the movable object 18 can be moved to a target position.

However, in consideration of the production errors of the piezoelectric materials and the driving displacement errors, the overall piezoelectric actuator system must be added with a positioning system. Referring to FIG. 2, a schematic side view of a piezoelectric actuator system 20 having a Hall sensor 21 is illustrated. The piezoelectric actuator system 20 includes the Hall sensor 21, an immovable base 22, a piezoelectric material 24, a drive shaft 26, a movable object 28, and a magnetic substance 25. The magnetic substance 25 is disposed on the movable object 28, and may be a magnet or a lodestone. The immovable base 22 includes a driving circuit 23. The driving circuit 23 is used for providing voltages to the piezoelectric material 24 and the Hall Sensor 21, and further detecting the voltage variation of the Hall sensor 21. The piezoelectric material 24 deforms under the influence of the voltage provided by the driving circuit 23.

The Hall sensor 21 senses a magnetic force emitted by the magnetic substance 25 disposed on the movable object 28. When the movable object 28 shifts, the magnetic force applied by the magnetic substance 25 on the Hall sensor 21 changes, and thus the induced voltage of the carrier of the Hall sensor 21 varies accordingly. The driving circuit 23 detects the voltage variations of the Hall sensor 21, and determines the position of the movable object 28 according to the voltage variations, thereby achieving the positioning and position detection functions.

However, in need of the Hall sensor 23 and the magnetic substance 25, the above piezoelectric actuator system 20 has a bulk volume, which goes against the miniaturization requirement.

SUMMARY OF THE INVENTION

Accordingly, the present invention is directed to a piezoelectric actuator system with a position detection function and a method thereof using the impedance detection to detect the position of a moveable object. Compared with the conventional piezoelectric actuator system and the method thereof, the piezoelectric actuator system and the method thereof provided by the present invention are advantageous in quick drive, low noise, power saving, small volume, more times of use, and so on.

The present invention provides a piezoelectric actuator system with a position detection function, which includes an immovable base, a piezoelectric material, a drive shaft, and a movable part. The immovable base has a driving circuit for providing a driving voltage. The piezoelectric material is fixed on the immovable base and electrically coupled to the driving circuit. The length of the piezoelectric material is controlled by the driving voltage. The drive shaft is fixed on the piezoelectric material, and has at least two conductive parts having impedance materials. The movable part is disposed on the drive shaft, and has a spacer made of a conductive material installed at a bottom thereof. The two conductive parts are electrically coupled to the spacer, so as to form a conduction path. The driving circuit detects an impedance of the conduction path to determine the position of the movable part.

In an embodiment of the present invention, the two conductive parts are comprised of a plurality of resistors, a plurality of inductors, or a plurality of capacitors.

In an embodiment of the present invention, the driving circuit provides the driving voltage according to the position of the movable part, so as to adjust the position of the movable part accordingly.

The present invention provides a method for a piezoelectric actuator with a position detection function, which includes the following steps. (a) A movable part and a drive shaft are provided. The movable part is disposed on the drive shaft and has a spacer made of a conductive material installed at the bottom thereof. The drive shaft has at least two conductive parts. The two conductive parts and the spacer form a conduction path. (b) A driving voltage is provided to change a length of the piezoelectric material, so as to move the movable part. The drive shaft is fixed on the piezoelectric material. (c) The position of the movable part is determined according to an impedance of the conduction path.

In an embodiment of the present invention, the two conductive parts are comprised of a plurality of resistors, a plurality of inductors, or a plurality of capacitors.

In an embodiment of the present invention, the method for a piezoelectric actuator with a position detection function further includes (d) providing a driving voltage according to the position of the movable part, so as to adjust the position of the movable part.

In the present invention, at least two conductive parts are disposed on the drive shaft. The spacer with a low resistance is installed at the bottom of the movable part. The two conductive parts are electrically coupled to the spacer with the low resistance, so as to form a conduction path. Finally, by detecting the impedance of the conduction path, the position of the movable part is obtained. Therefore, compared with the conventional piezoelectric actuator system, the present invention has the advantages of quick drive, low noise, power saving, small volume, more times of use, and so on. Therefore, the piezoelectric actuator system and method thereof provided by the present invention are applicable to a lens module of a camera phone or a pickup head of a thin-type optical disk drive.

In order to the make aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
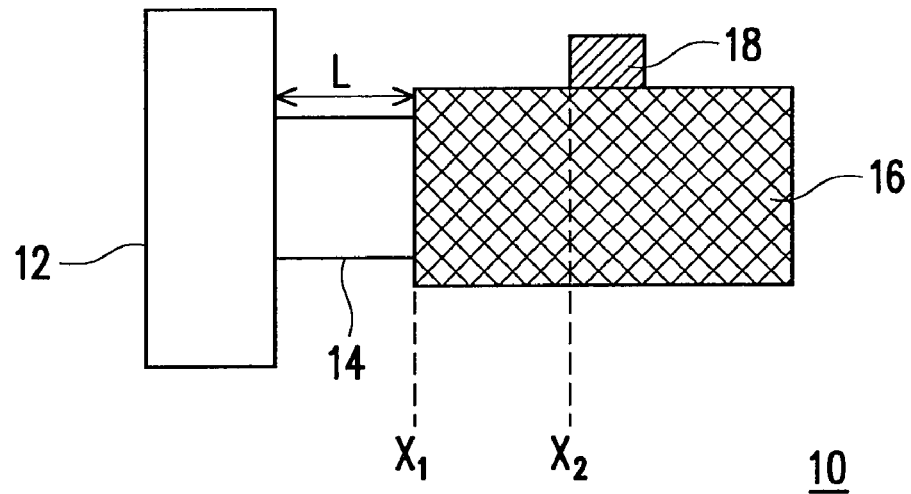
FIG. 1A is a schematic side view of a conventional piezoelectric actuator system 10 in a stationary state.
Figure 1B:
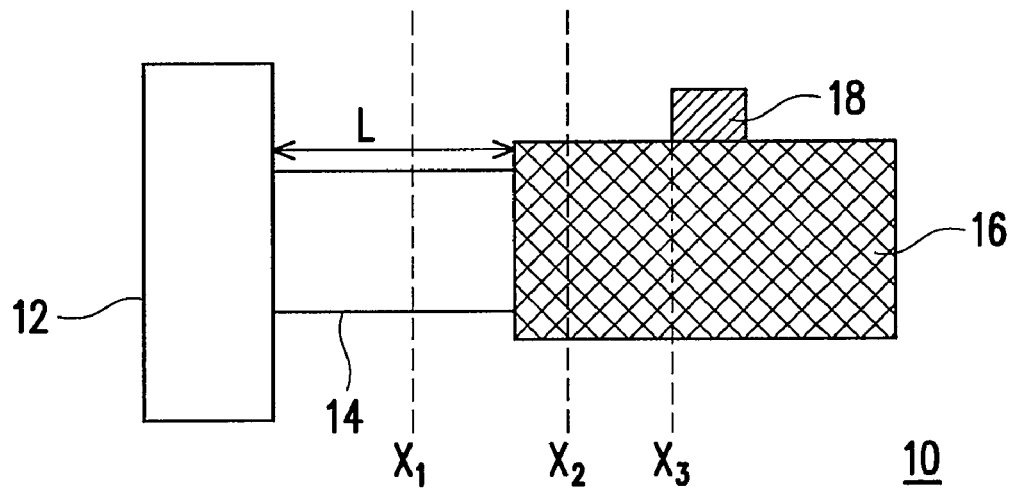
FIG. 1B is a schematic side view of the conventional piezoelectric actuator system 10 when a slowly increasing voltage is applied on the piezoelectric material 14.
Figure 1C:
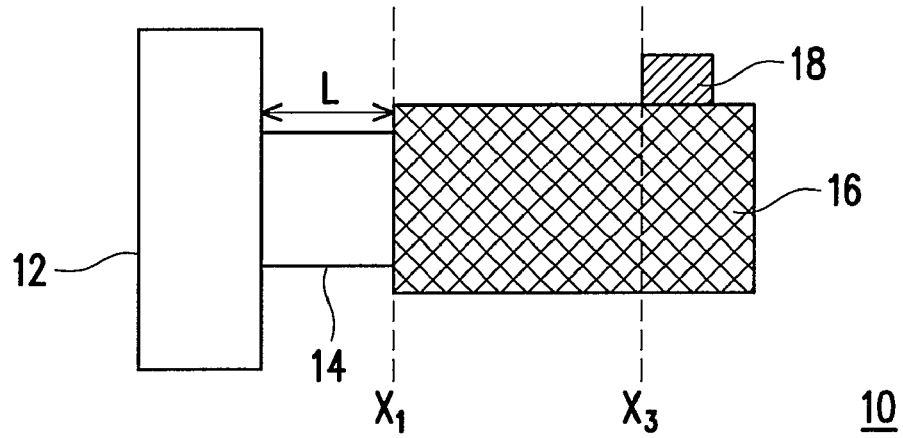
FIG. 1C is a schematic side view of the conventional piezoelectric actuator system 10 when a rapidly dropping voltage is applied on the piezoelectric material 14.
Figure 2:
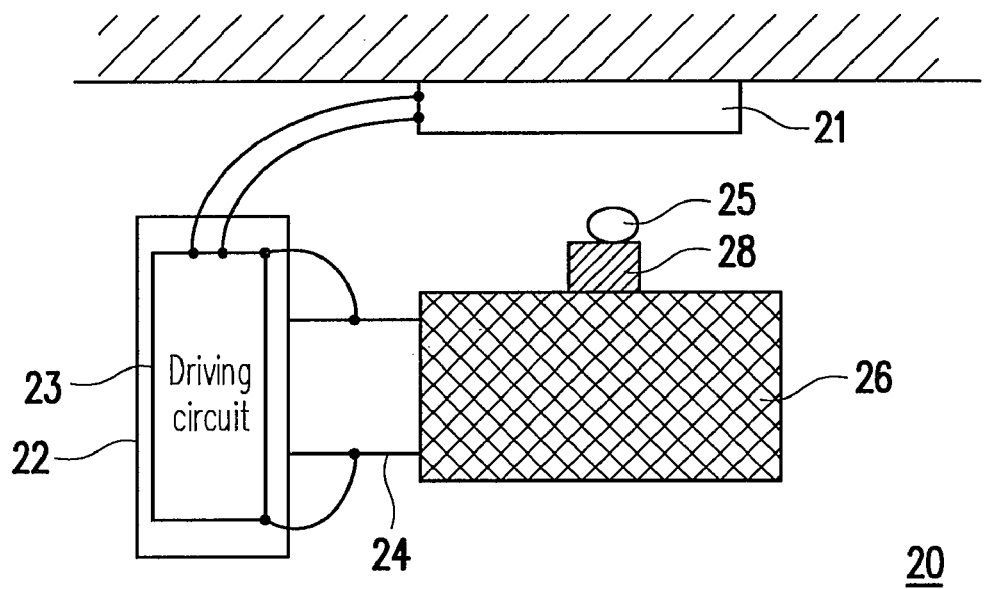
FIG. 2 is a schematic side view of a piezoelectric actuator system 20 having a Hall sensor 21.

Reference will now be made in detail to the present embodiments of the invention, examples of which are illustrated in the accompanying drawings. Wherever possible, the same reference numbers are used in the drawings and the description to refer to the same or like parts.

In the trend of light and thin products, the piezoelectric actuator system provided by the embodiment of the present invention has a small size and is applicable to a lens module of a camera phone and a pickup head of a thin-type optical disk drive. Further, compared with other conventional piezoelectric actuator systems, the piezoelectric actuator system provided by the embodiments of the present invention has the advantages of quick drive, low noise, power saving, more times of use, and so on.

Figure 3A:
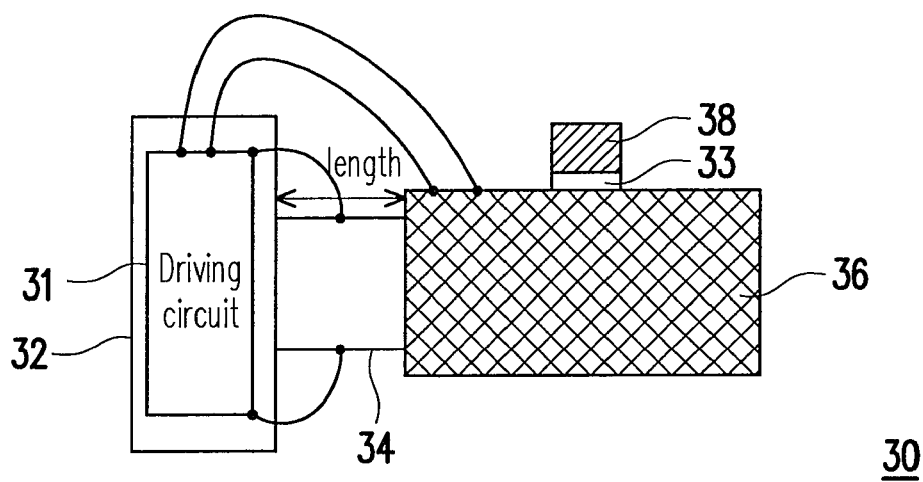
FIG. 3A is a schematic side view of a piezoelectric actuator system 30 according to an embodiment of the present invention.
Figure 3B:
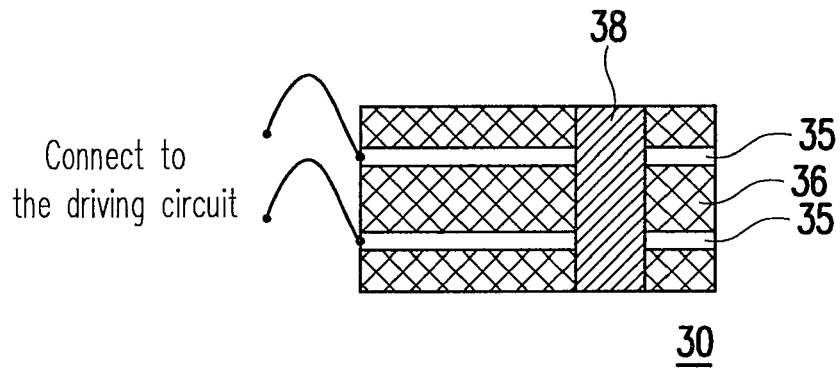
FIG. 3B is a schematic top view of the piezoelectric actuator system 30 according to an embodiment of the present invention.

FIG. 3A is a schematic side view of a piezoelectric actuator system 30 according to an embodiment of the present invention. Referring to FIG. 3A, the piezoelectric actuator system 30 with a position detection function includes an immovable base 32, a piezoelectric material 34, a drive shaft 36, and a movable part 38. The immovable base 32 has a driving circuit 31 for providing a driving voltage. The piezoelectric material 34 is fixed on the immovable base 32 and electrically coupled to the driving circuit 31. The length of the piezoelectric material 34 is controlled by the driving voltage. The drive shaft 36 is fixed on the piezoelectric material 34, and has at least two conductive parts 35 (as shown in FIG. 3B) having impedance materials. The movable part 38 is disposed on the drive shaft 36, and a spacer 33 made of a conductive material is installed at the bottom thereof. The two conductive parts 35 are electrically coupled to the spacer 33, so as to form a conduction path. The driving circuit 31 detects an impedance of the conduction path to determine the position of the movable part 38.

FIG. 3B is a schematic top view of the piezoelectric actuator system 30 according to an embodiment of the present invention. Referring to FIG. 3B, in this embodiment, the two conductive parts 35, together with the spacer 33 (not shown in FIG. 3B, and the spacer 33 is disposed at the bottom of the movable part 38), form the conduction path. The driving circuit 31 obtains the position of the movable part 38 according to the impedance of the conduction path. The piezoelectric actuator system 30 provided by this embodiment is simple and easy to implement and does not need any complex positioning system, thus having the advantages of quick drive, low noise, power saving, small volume, easy to implement, more times of use, and so on.

Figure 3C:
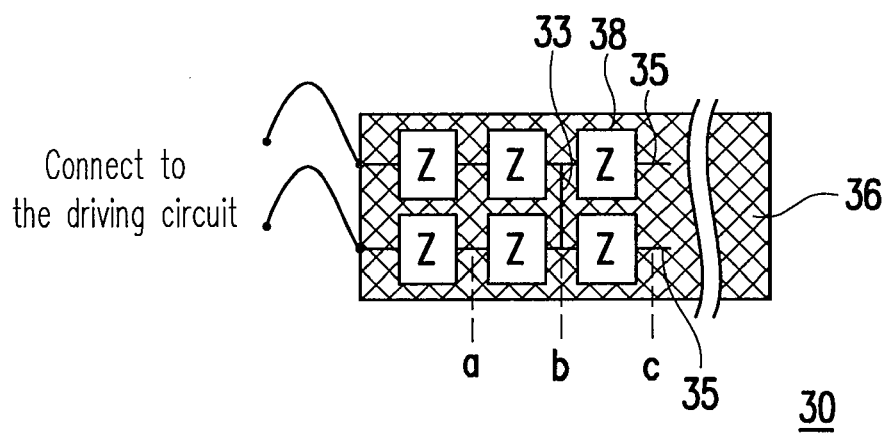
FIG. 3C is an equivalent circuit diagram of a conduction path electrically formed by two conductive parts 35 and a spacer 33.

FIG. 3C is an equivalent circuit diagram of the conduction path electrically formed by two conductive parts 35 and a spacer 33. Referring to FIG. 3C, the conductive parts 35 may be equivalent to a combination of a plurality of impedors Z. In this embodiment, the spacer 33 is made of a conductive material with a low resistance (almost zero), and thus the spacer 33 may be equivalent to a lead. In FIG. 3C, when the driving circuit 31 detects that the impedance of the conduction path is 4Z, it is known that the movable part 38 is at the position b. Similarly, when the movable part 38 is at the position a, the impedance detected by the driving circuit 31 is 2Z. When the movable part 38 is at the position c, the impedance detected by the driving circuit 31 is 6Z.

In addition, through detecting the impedance of the conduction path, the driving circuit 31 can also determine whether or not to provide the driving voltage to move the movable part 38 to a predetermined target position. For example, the user intends to move the movable part 38 to the position c, but the movable part 38 just moves to the position b due to the unstable driving voltage or process variations of the piezoelectric material 34. At this time, the impedance detected by the driving circuit 31 is merely 4Z. Thus, the driving circuit 31 further provides a driving voltage to the piezoelectric material 34, so as to make the movable part 38 move to the position c.

Figure 3D:
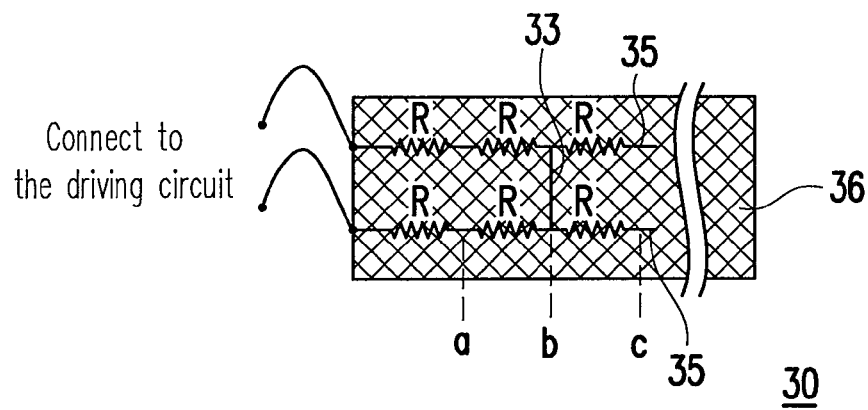
FIGS. 3D to 3F are equivalent circuit diagrams when impedors Z are implemented by resistors R, inductors L, and capacitors C respectively.
Figure 3E:
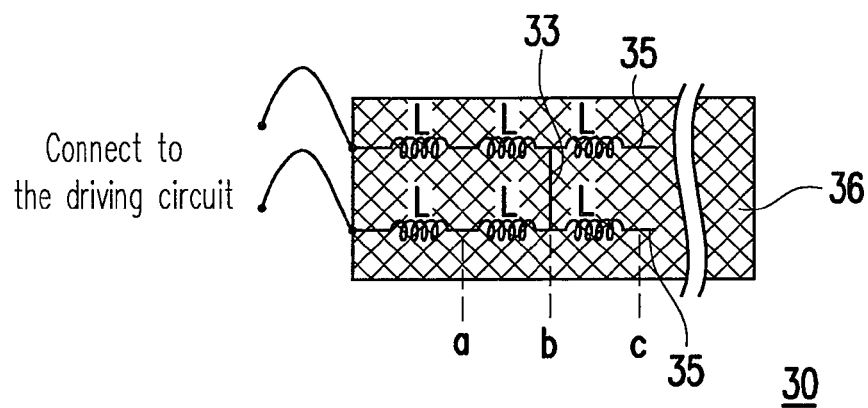
Figure 3F:
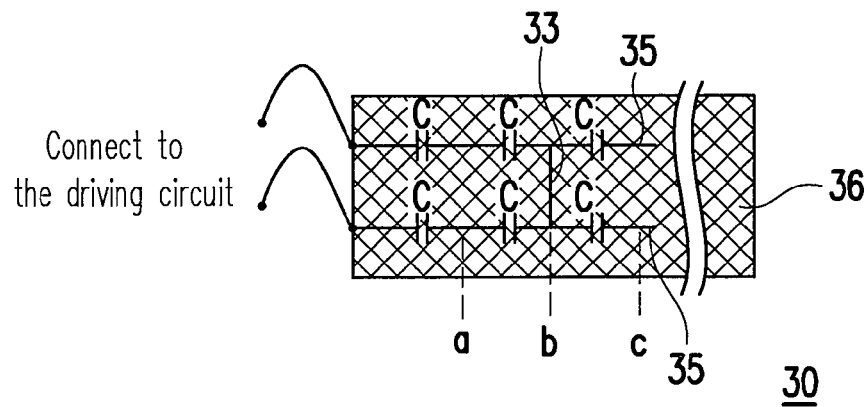

FIGS. 3D to 3F are equivalent circuit diagrams when the impedors Z are implemented by resistors R, inductors L, and capacitors C respectively, which, however, are not intended to limit the scope of the present invention. In addition, through sending a known reference current to obtain a voltage difference of the conduction path, the driving circuit 31 can detect the impedance of the conduction path, thereby obtaining the position of the movable part 38.

Figure 4:
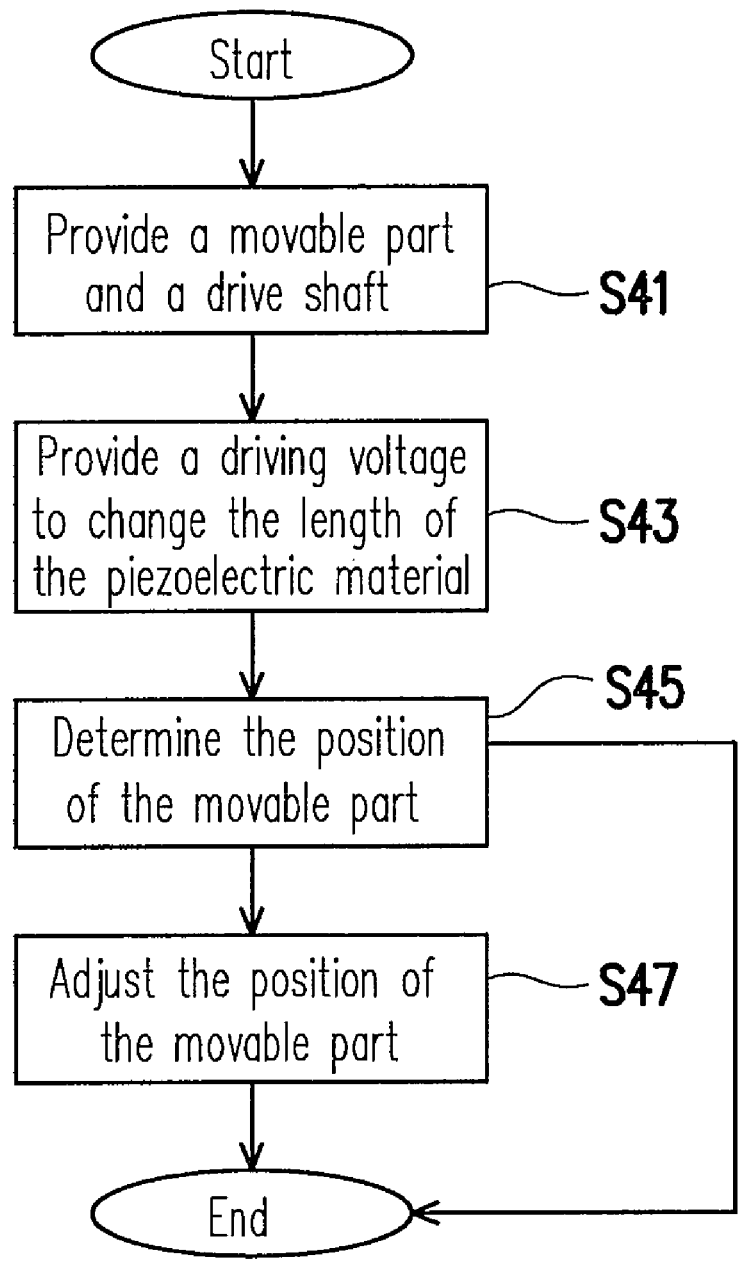
FIG. 4 is a flow chart illustrating processes of a method for a piezoelectric actuator with a position detection function according to an embodiment of the present invention.

Finally, referring to FIG. 4, a schematic view of processes of a method for a piezoelectric actuator with a position detection function according to an embodiment of the present invention is illustrated. The method includes the following steps. (S41) A movable part and a drive shaft are provided. The movable part is disposed on the drive shaft. A spacer made of a conductive material is installed at the bottom of the movable part. The drive shaft has at least two conductive parts, and the two conductive parts and the spacer form a conduction path. (S43) A driving voltage is provided to change the length of the piezoelectric material, so as to move the movable part. The drive shaft is fixed on the piezoelectric material. (S45) The position of the movable part is determined according to the impedance of the conduction path.

Further, when the movable part 38 has not moved to the target position, the method further includes (S47) providing a driving voltage according to the position of the movable part, so as to adjust the position of the movable part. Therefore, through step S47, the above method can move the movable part 38 to the predetermined target position In view of the above, the piezoelectric actuator system provided by the embodiments of the present invention uses the impedance detection to determine the position of the movable part, and thus the entire system is simple and does not need any additional complex circuit. Therefore, the present invention has advantages of quick drive, low noise, power saving, small volume, easy to implement, more times of use, and so on.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A piezoelectric actuator system with a position detection function, comprising:

an immovable base, comprising a driving circuit for providing a driving voltage;

a piezoelectric material, fixed on the immovable base, and electrically coupled to the driving circuit, wherein a length of the piezoelectric material is controlled by the driving voltage;

a drive shaft, fixed on the piezoelectric material, and comprising at least two conductive parts having impedance materials; and a movable part, disposed on the drive shaft, and comprising a spacer made of a conductive material installed at a bottom thereof;

wherein the two conductive parts are electrically coupled to the spacer, so as to form a conduction path, and the driving circuit detects an impedance of the conduction path to determine a position of the movable part.

2. The piezoelectric actuator system with a position detection function according to claim 1, wherein the two conductive parts are comprised of a plurality of resistors.

3. The piezoelectric actuator system with a position detection function according to claim 1, wherein the two conductive parts are comprised of a plurality of inductors.

4. The piezoelectric actuator system with a position detection function according to claim 1, wherein the two conductive parts are comprised of a plurality of capacitors.

5. The piezoelectric actuator system with a position detection function according to claim 1, wherein the driving circuit provides the driving voltage according to the position of the movable part, so as to adjust the position of the movable part.

6. The piezoelectric actuator system with a position detection function according to claim 1, wherein the piezoelectric actuator system with a position detection function is adapted to a lens module of a camera phone or a pickup head of a thin-type optical disk drive.

7. The piezoelectric actuator system with a position detection function according to claim 1, wherein the driving circuit sends a known reference current to obtain a voltage difference of the conduction path, so as to detect the impedance of the conduction path to obtain the position of the movable part.

8. A method for a piezoelectric actuator with a position detection function, comprising:

providing a movable part and a drive shaft, wherein the movable part is disposed on the drive shaft, a spacer is installed at a bottom of the movable part, the spacer is made of a conductive material, and the drive shaft comprises at least two conductive parts, wherein the two conductive parts are electrically connected with the spacer, so as to form a conduction path;

providing a driving voltage to change a length of a piezoelectric material, so as to move the movable part, wherein the drive shaft is fixed on the piezoelectric material; and determining a position of the movable part according to an impedance of the conduction path.

9. The method for a piezoelectric actuator with a position detection function according to claim 8, wherein the two conductive parts are comprised of a plurality of resistors.

10. The method for a piezoelectric actuator with a position detection function according to claim 8, wherein the two conductive parts are comprised of a plurality of inductors.

11. The method for a piezoelectric actuator with a position detection function according to claim 8, wherein the two conductive parts are comprised of a plurality of capacitors.

12. The method for a piezoelectric actuator with a position detection function according to claim 8, further comprising:
providing the driving voltage according to the position of the movable part, so as to adjust the position of the movable part.

13. The method for a piezoelectric actuator with a position detection function according to claim 8, wherein the piezoelectric actuation method with a position detection function is applicable to a lens module of a camera phone or a pickup head of a thin-type optical disk drive.

14. The method for a piezoelectric actuator with a position detection function according to claim 8, wherein the driving circuit sends a known reference current to obtain a voltage difference of the conduction path, so as to detect the impedance of the conduction path to obtain the position of the movable part.

* * * * *